US00RE46490E

(19) United States
(12) Reissued Patent
Seshita

(10) Patent Number: US RE46,490 E
(45) Date of Reissued Patent: Jul. 25, 2017

(54) SEMICONDUCTOR DEVICE

(71) Applicant: KABUSHIKI KAISHA TOSHIBA, Tokyo (JP)

(72) Inventor: Toshiki Seshita, Kanagawa (JP)

(73) Assignee: KABUSHIKI KAISHA TOSHIBA, Tokyo (JP)

(21) Appl. No.: 14/801,095

(22) Filed: Jul. 16, 2015

Related U.S. Patent Documents

Reissue of:
(64) Patent No.: 8,487,688
Issued: Jul. 16, 2013
Appl. No.: 13/229,985
Filed: Sep. 12, 2011

(30) Foreign Application Priority Data

Nov. 29, 2010 (JP) ..... 2010-265311

(51) Int. Cl.
*H03K 3/00* (2006.01)

(52) U.S. Cl.
CPC ..... *H03K 3/00* (2013.01)

(58) Field of Classification Search
CPC ..... H03K 3/00
USPC ..... 327/108–112, 333; 326/80–83
See application file for complete search history.

(56) References Cited

U.S. PATENT DOCUMENTS 6,476,641 B2 * 11/2002 Yoshida ..... 326/83
7,436,205 B2 * 10/2008 Tada ..... 326/33
7,906,988 B2 * 3/2011 Ohta et al. ..... 326/58
8,686,708 B2 * 4/2014 Ishimori ..... H02M 3/073 323/350
2011/0050323 A1 3/2011 Seshita

FOREIGN PATENT DOCUMENTS

JP 2000-294786 10/2000
JP 2000-294786 A 10/2000

* cited by examiner

*Primary Examiner* — My-Trang Ton
(74) *Attorney, Agent, or Firm* — Patterson & Sheridan, LLP

(57) ABSTRACT

According to one embodiment, a semiconductor device includes an interface, a power supply, a driver, and a switch section. The interface includes a first MOSFET and converts a terminal switch signal of input serial data into parallel data. The first MOSFET is provided on the SOI substrate and has a back gate in a floating state. The power supply includes a second MOSFET and generates an ON potential higher than a potential of a power supply to be supplied to the interface. The second MOSFET is provided on the SOI substrate and has a back gate connected to a source. The driver includes a third MOSFET and outputs a control signal for controlling the ON potential to be in a high level according to the parallel data. The third MOSFET is provided on the SOI substrate and has a back gate connected to a source.

33 Claims, 6 Drawing Sheets

SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is based upon and claims the benefit of priority from the prior Japanese Patent Application No. 2010-265311, filed on Nov. 29, 2010; the entire contents of which are incorporated herein by reference.

FIELD

Embodiments described herein relate generally to a semiconductor device.

BACKGROUND

A semiconductor switch for opening and closing a circuit can be used for various electric devices. For example, in a radio frequency circuit of a mobile telephone, a transmitting circuit and a receiving circuit are selectively connected to a common antenna through a radio frequency switching circuit. It is used that a MOSFET (Metal Oxide Semiconductor Field Effect Transistor) is formed on an SOI (Silicon On Insulator) substrate for a switching device of such radio frequency switching circuit. Moreover, a terminal switch signal for switching connection between terminals is transmitted in parallel.

However, to meet a demand for an increase in the number of radio frequency terminals with an increase in frequency band, or systemization, high speed serial transmission of terminal switch signal has been considered. In the meantime; however, an increase in power consumption has been a concern.

DETAILED DESCRIPTION

Figure 1:
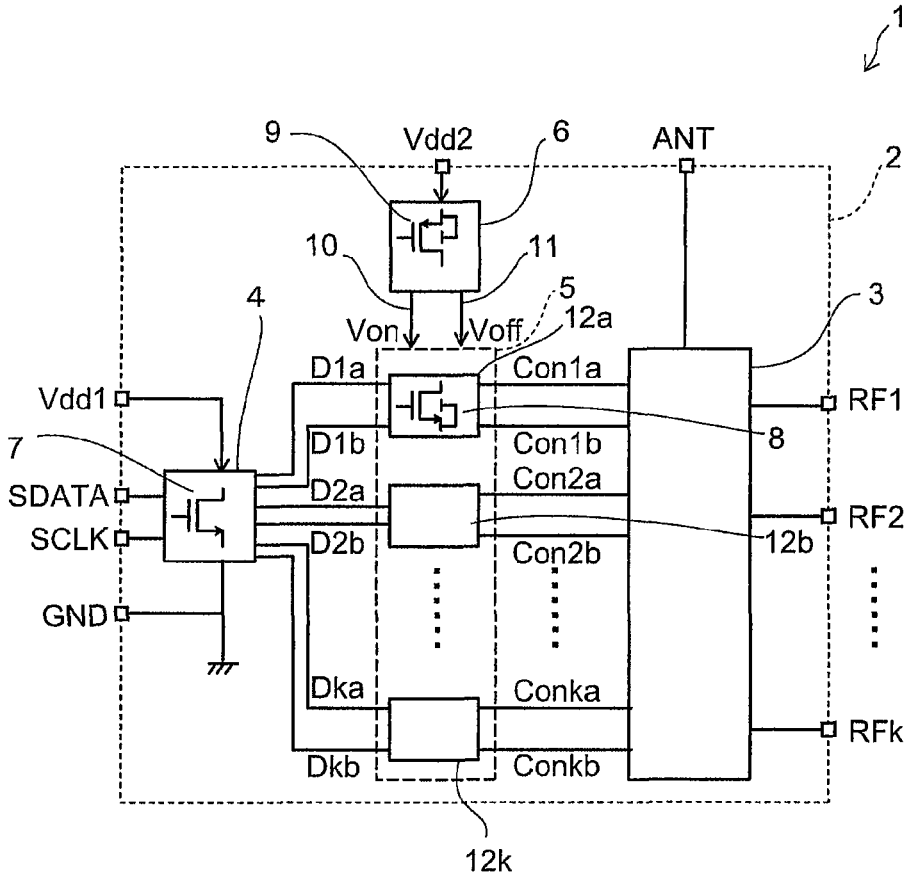
FIG. 1 is a block diagram illustrating a configuration of a semiconductor device according to a first embodiment.

In general, according to one embodiment, a semiconductor device includes an interface, a power supply, a driver, and a switch section. The interface includes a first MOSFET and converts a terminal switch signal of input serial data into parallel data. The first MOSFET is provided on the SOI substrate and has a back gate in a floating state. The power supply includes a second MOSFET and generates an ON potential higher than a potential of a power supply to be supplied to the interface. The second MOSFET is provided on the SOI substrate and has a back gate connected to a source. The driver includes a third MOSFET and outputs a control signal for controlling the ON potential to be in a high level according to the parallel data. The third MOSFET is provided on the SOI substrate and has a back gate connected to a source.

Embodiments will now be described in detail with reference to the drawings. The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions. In the specification and the drawings of the application, components similar to those described in regard to a drawing thereinabove are marked with like reference numerals, and a detailed description is omitted as appropriate.

First Embodiment

FIG. 1 is a block diagram illustrating a configuration of a semiconductor device according to a first embodiment.

As shown in FIG. 1, a semiconductor device 1 is provided on an SOI substrate 2 with a common terminal ANT, radio frequency terminals RF1 to RFk (k being a natural number of 2 or more) and a switch section 3 for switching connection between terminals. The switch section 3 switches connection between terminals in response to control signals Con1a-Conka, Con1b-Conkb output from a driver 5.

An interface 4 is provided on the SOI substrate 2, and converts a terminal switch signal of serial data input to a switch signal terminal SDATA into 2k-bit parallel data D1a-Dka, D1b-Dkb in which each bit is a differential signal. Here, k-bit parallel data D1b-Dkb are inverted data of k-bit parallel data D1a-Dka respectively.

In the interface 4, for example, a serial-to-parallel converter is provided for converting serial data into parallel data. The converted 2k-bit parallel data D1a-Dka, D1b-Dkb are held in a hold circuit such as a latch circuit or the like, and are output to the driver 5.

As will be explained in FIG. 5, the interface 4 includes a first MOSFET 7 operable at high speed, and is supplied with a power supply potential Vdd1. In FIG. 1, an N-channel type MOSFET (hereinafter NMOS) is illustrated as the first MOSFET 7. However, a P-channel type MOSFET (hereinafter PMOS) may be adopted.

The parallel data D1a-Dka, D1b-Dkb are level-shifted in the driver 5 provided on the SOI substrate 2 to be output as 2k-bit control signals Con1a-Conka, Con1b-Conkb. Here, k-bit control signals Con1b-Conkb are inverted signals of Con1a-Conka respectively.

The driver 5 supplies an ON potential Von and an OFF potential Voff.

Here, the ON potential Von is a high level potential of control signals Con1a-Conka, Con1b-Conkb. The ON potential Von is to be applied to a gate of each FET of the switch section 3 to turn it ON, and has a potential to make an ON resistance sufficiently low value, for example, 3.5 V.

On the other hand, the OFF potential Voff is a low level potential of the control signals Con1a-Conka, Con1b-

Conkb. The OFF potential is to be applied to the gate of each FET of the switch section 3 to turn it OFF, and has a potential to sufficiently maintain the OFF state even if a radio frequency signal is superimposed. The OFF potential is, for example, −1.5 V.

The ON potential Von and the OFF potential Voff are supplied from a power supply 6 provided on the SOI substrate 2. The power supply 6 is supplied externally with a positive power supply potential Vdd2. The power supply 6 generates an ON potential Von which is higher than the power supply potential Vdd2, and a negative OFF potential Voff. The ON potential Von is higher than the power supply potential Vdd1 of the interface 4. The power supply 6 includes, for example, an oscillator, a charge pump and the like, and is formed on the SOI substrate 2.

Figure 6:
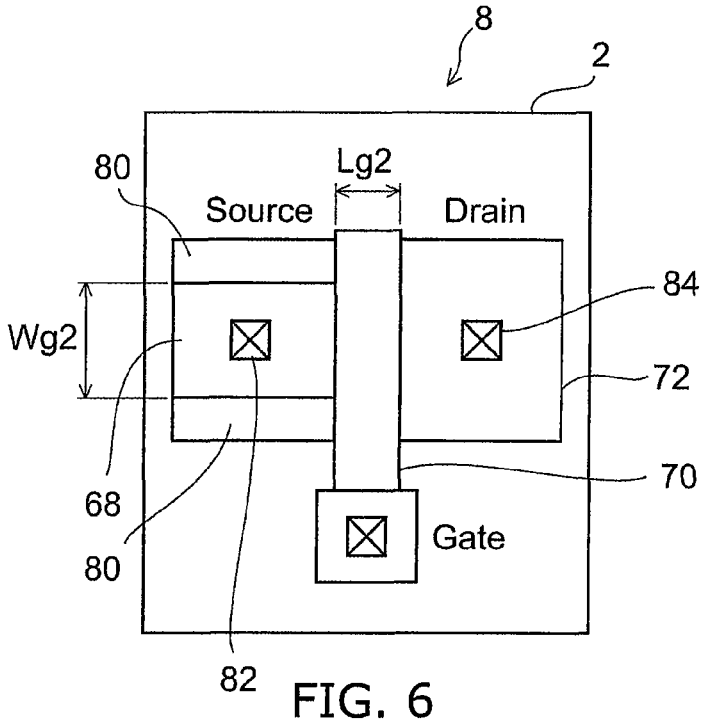
FIG. 6 is a plan view illustrating a layout of a second MOSFET of the semiconductor device.

As explained in FIG. 6, in order to output an ON potential Von in a high level, the drive 5 includes a second MOSFET 8 of high breakdown voltage. On the other hand, in order to generate the ON potential Von and the OFF potential Voff, the power supply 6 includes a third MOSFET 9 of high breakdown voltage. In FIG. 1, the NMOS and the PMOS are illustrated as the MOSFET 8 and the MOSFET 9, respectively. However, either of the PMOS and the NMOS may be adopted for the second and the third MOSFETs 8 and 9.

The semiconductor device 1 is a switch of SPkT (Single-Pole k-Throw) that switches connection between the common terminal ANT and the radio frequency terminals RF1-RFk in response to a terminal switch signal of serial data input to the switch signal terminal SDATA.

Next, each section will be explained.

Figure 2:
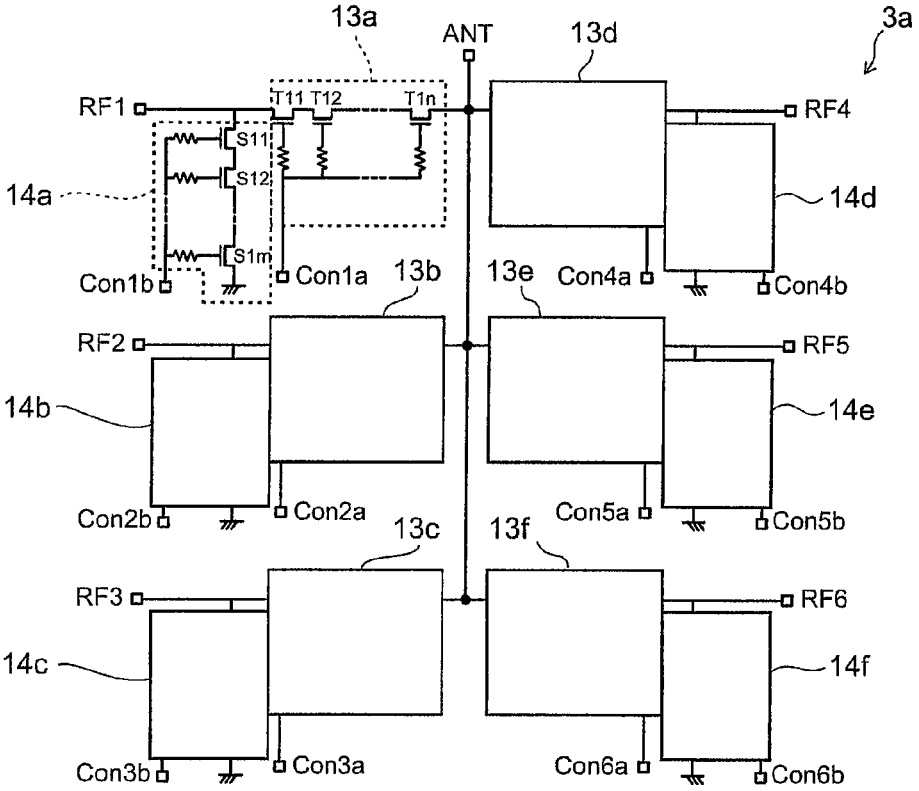
FIG. 2 is a circuit diagram illustrating a configuration of a switch section of the semiconductor device shown in FIG. 1.

FIG. 2 is a circuit diagram illustrating a configuration of a switch section of the semiconductor device shown in FIG. 1.

As shown in FIG. 2, a configuration of an SP6T switch is illustrated in the switch section 3a. First switching elements 13a, 13b, 13c, 13d, 13e and 13f are connected respectively between the common terminal ANT and radio frequency terminals RF1, RF2, RF3, RF4, RF5 and RF6. By turning ON the first switching elements 13a, 13b, 13c, 13d, 13e and 13f, transmission paths are formed between the common terminal ANT, and the radio frequency terminals RF1, RF2, RF3, RF4, RF5 and RF6 respectively.

The first switching element 13a includes n-stage (n is a natural number) through FETs T11, T12, . . . , T1n connected in series. To respective gates of the through FETs T11, T12, . . . , T1n, a control signal Con1a is input through resistors for preventing leakage of radio frequency. The first switching elements 13b, 13c, 13d, 13e and 13f respectively have the same configuration as the first switching element 13a. To the first switching elements 13b, 13c, 13d, 13e and 13f, control signals Con2a, Con3a, Con4a, Con5a and Con6a are input respectively.

Second switching elements 14a, 14b, 14c, 14d, 14e and 14f are connected respectively between the radio frequency terminals RF1, RF2, RF3, RF4, RF5 and RF6 and ground GND. These second switching elements 14a, 14b, 14c, 14d, 14e and 14f release leakage current respectively flowing in the radio frequency terminals RF1, RF2, RF3, RF4, RF5 and RF6 to the ground when the first switching devices 13a, 13b, 13c, 13d, 13e and 13f are turned OFF respectively. Thereby, improving isolation is achieved among the radio frequency terminals RF1, RF2, RF3, RF4, RF5 and RF6.

The second switching element 14a includes m-stage (m is a natural number) shunt FETs S11, S12, . . . , S1m connected in series. To respective gates of the shunt FETs S11, S12, . . . , S1m, a control signal Con1b is input through resistors for preventing leakage of radio frequency. The second switching elements 14b, 14c, 14d, 14e and 14f respectively have the same configuration as the second switching element 14a. To the second switching elements 14b, 14c, 14d, 14e and 14f, control signals Con2b, Con3b, Con4b, Con5b and Con6b are input respectively.

For example, to allow conduction between the radio frequency terminal RF1 and the common terminal ANT, the first switching element 13a, which is between the radio frequency terminal RF1 and the common terminal ANT, is turned ON, and the second switching element 14a, which is between the radio frequency terminal RF1 and the ground, is turned OFF. Namely, all the through FETs T11, T12, . . . , Tin of the first switching element 13a are turned ON, and all the shunt FETs S11, S12, . . . , S1m of the second switching element 14a are turned OFF.

At the same time, all the other first switching elements 13b, 13c, 13d, 13e and 13f, which are respectively provided between the radio frequency terminals RF2, RF3, RF4, RF5 and RF6 and the common terminal ANT, are turned OFF, and all the other second switching elements 14b, 14c, 14d, 14e and 14f, which are respectively provided between the radio frequency terminals RF2, RF3, RF4, RF5 and RF6 and the ground, are turned ON. Namely, all the through FETs of the first switching elements 13b, 13c, 13d, 13e and 13f are turned OFF, and all the shunt FETs of the second switching elements 14b, 14c, 14d, 14e and 14f are turned ON.

In the above case, the control signal Con1a is set to the ON potential Von, the control signals Con2b, Con3b, Con4b, Con5b and Con6b are set to the ON potential Von, the control signal Con1b is set to the OFF potential Voff, and the control signals Con2a, Con3a, Con4a, Con5a and Con6a are set to the OFF potential Voff.

In FIG. 2, the SP6T switch is illustrated for the configuration of the switch section 3a. However, a switch of other configuration is also applicable, and a configuration of an wPkT switch (w is a natural number, and K is a natural number of 2 or more) may be adopted.

Referring back to FIG. 1, the driver 5 has level shifters 12a-12k in the number of k (k is a natural number of 2 or more) that is the same number as the number of the radio frequency terminals RF1-RFk. Since all the level shifters 12a to 12k have the same configuration, the configuration of the level shifter 12a will be explained here.

Figure 3:
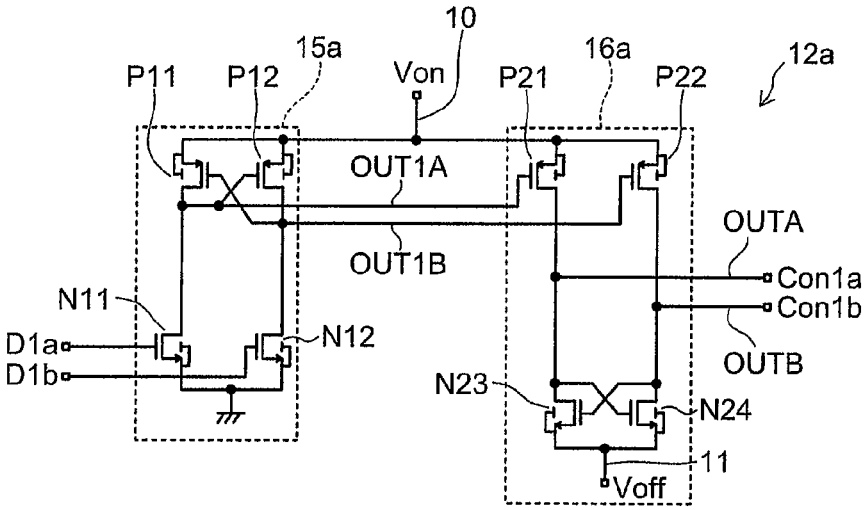
FIG. 3 is a circuit diagram illustrating a configuration of a level shifter of a driver of the semiconductor device shown in FIG. 1.

FIG. 3 is a circuit diagram illustrating a configuration of a level shifter of the driver of the semiconductor device shown in FIG. 1.

The level shifter 12a has a first-stage level shifter 15a and a second-stage level shifter 16a. The first-stage level shifter 15a has a pair of NMOSs N11 and N12, and a pair of PMOSs P11 and P12. The second-stage level shifter 16a has a pair of PMOSs P21 and P22, and a pair of NMOSs N23 and N24.

Sources of the NMOSs N11 and N12 are connected to the ground respectively. Gates of the NMOSs N11 and N12 respectively receive data D1a and D1b output from the interface 4 of the first stage. The data D1a and D1b are 2-bit differential data of 2k-bit differential parallel data D1a-Dka, D1b-Dkb output from the interface 4. The data D1b is inverted data of data D1a.

Drains of the NMOSs N11 and N12 are connected to drains of the PMOSs P11 and P12 respectively. The sources of the PMOSs P11 and P12 receive the ON potential Von supplied respectively from the power supply 6 through a high potential power supply line 10. The gate of the PMOS P11 is connected to the drain of the PMOS P12, and these are connected to one output line OUT1B of a differential output from the first-stage level shifter 15a. The gate of the PMOS P12 is connected to the drain of the PMOS P11, and these are connected to the other output line OUT1A of the differential output from the first-stage level shifter 15a.

The output lines OUT1A and OUT1B are respectively connected to the gates of the PMOSs P21 and P22 of the second-stage level shifter 16a. The output signal from the first-stage level shifter 15a is input to the second-stage level shifter 16a through the output lines OUT1A and OUT1B. The ON potential Von is supplied from the power supply 6 to the respective sources of the PMOSs P21 and P22 through the high potential power supply line 10.

The drain of the PMOS P21 is connected to the drain of the NMOS N23, and these drains are further connected to the output line OUTA respectively. The drain of the PMOS P22 is connected to the drain of the NMOS N24, and these drains are further connected to the output line OUTB. The ON potential Von and the OFF potential Voff of the control signals Con1a and Con1b to be respectively output to the output lines OUTA and OUTB are supplied to the respective gates of the through FETs and the shunt FETs of the switch section 3a shown in FIG. 2.

The input level of the differential data D1a and D1b to be input to the first-stage level shifter 15a is a high level of Vdd1 (for example, 1.8 V) and a low level of 0 V, and these differential data D1a and D1b are supplied from the interface 4 shown in FIG. 1. For example, 3.5 V is supplied as the ON potential Von to the high potential power supply line 10.

For example, when the differential data D1a is input with high level (1.8 V) and the differential data D1b is input with low level (0 V), the potential of the output line OUT1A is set to low level (0 V), and the potential of the output line OUT1B is set to 3.5 V, which is equal to the ON potential Von. In other words, the output amplitude in the first-stage level shifter 15a is approximately 3.5 V, from 0 to Von.

The second-stage level shifter 16a receives the output signal of the first-stage level shifter 15a. In the same manner as the first-stage level shifter 15a, the ON potential Von is supplied to the second-stage level shifter 16a through the high potential power supply line 10, and the OFF potential Voff is supplied to the second-stage level shifter 16a through the low potential power supply line 11.

The ON potential Von is, for example, 3.5 V. The OFF potential is, for example, −1.5 V.

For example, when the output line OUT1A is at low level (0 V) and the output line OUT1B is at high level (3.5 V), the potential of the output line OUTA, i.e., the potential of the control signal Con1a is set to 3.5 V, which is equal to the ON potential Von, and the potential of the output terminal OUTB, i.e., the potential of the control signal Con1b is set to −1.5 V, which is equal to the OFF potential Voff. Accordingly, 3.5 V as the ON potential Von and −1.5 V as the OFF potential Voff can be supplied to the gates of the through FETs and shunt FETs of the switch section 3 shown in FIG. 2, thereby driving the switch section 3.

The first-stage level shifter 15a transforms the potential of the high level into the ON potential Von. The second-stage level shifter 16a transforms the potential of the low level into the OFF potential Voff. Accordingly, the level shifter 12a transforms an input signal in which the high level is the power supply potential Vdd1 and the low level is 0 V into the control signal Con1a and the control signal Con1b in which the high level is the ON potential Von and the low level is the OFF potential Voff, respectively.

In the level shifter 15a, the gate-source voltage and the drain-source voltage of each FET of the first-stage level shifter 15a might become 3.5 V, which is equal to the ON potential Von. Moreover, the gate-source voltage and the drain-source voltage of each FET of the second-stage level shifter 16a might become 5.0 V, which is equal to the ON potential Von—the OFF potential Voff. Therefore, the level shifter 15a is configured by FETs of high breakdown voltage.

As explained with reference to FIG. 6, each FET of the level shifter 15a is configured by the second MOSFET 8.

Figure 5:
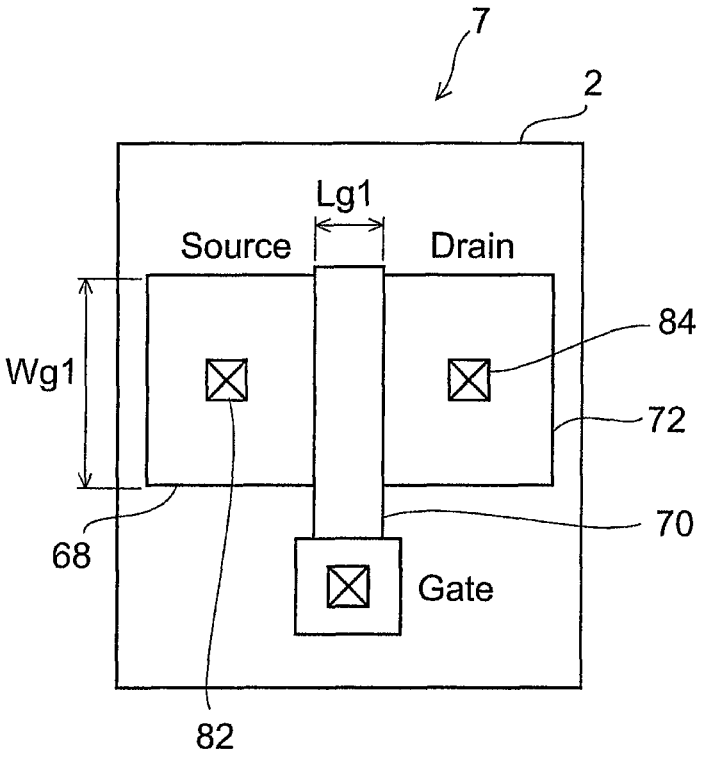
FIG. 5 is a plan view illustrating a layout of a first MOSFET of the semiconductor device.

Various configurations exist as a circuit configuration of the level shifter 15a other than the circuit configuration illustrated in FIG. 5. For the level shifter of the semiconductor device 1, any circuit configuration may be adopted as long as the function of level shifting the high level to the ON potential Von higher than the positive power supply potential Vdd2 to be supplied externally and level shifting the low level to the negative OFF potential Voff.

Referring back to FIG. 1, the interface 4 transforms a terminal switch signal of serial data input to the switch signal terminal SDATA into 2k-bit parallel data D1a-Dka, D1b-Dkb in which each bit is a differential signal.

The serial data is input to the switch signal terminal SDATA in sync with a clock signal input to a clock terminal SCLK.

The serial data and the clock signal are output from a microprocessor, for example. The clock signal has been sped up as the microprocessor speeds up. On the other hand, there is a restriction in allowable current consumption in the interface 4 as the power consumption becomes low. Therefore, the power supply potential Vdd1 of lower potential is supplied to the interface 4 compared to the case of the switch section 3 or the driver 5.

Figure 4:
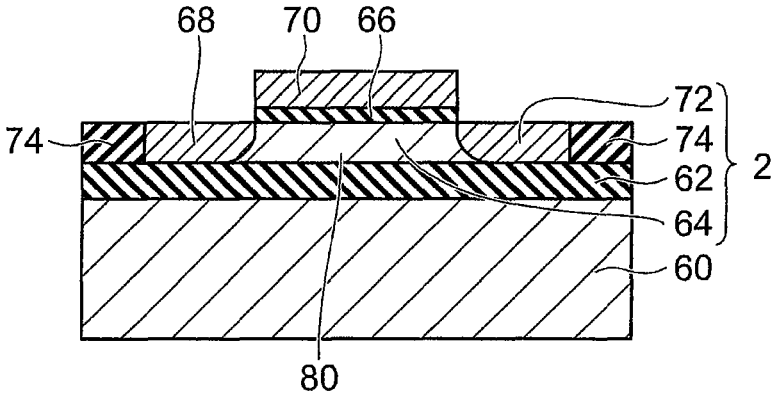
FIG. 4 is a cross-sectional view of a transistor of the semiconductor device.

FIG. 4 is a cross-sectional view of a transistor of the semiconductor device.

In FIG. 4, a cross-sectional view of the NMOS provided on the SOI substrate 2 is shown schematically.

In a silicon (Si) substrate 60, an embedded oxide film layer 62 is provided. On the embedded oxide film layer 62, a source region 68 and a drain region 72 are provided so as to sandwich an SOI layer 64 in between. An element isolation layer 74 is provided on the embedded oxide film layer 62 so as to surround the source region 68, the SOI layer 64 and the drain region 72. Further, a gate electrode 70 is provided on the source region 68, the SOI layer 64 and the drain region 72 via a gate oxide film 66.

The lower side of a channel of the first MOSFET 7 is the embedded oxide film layer 62, and is insulated from the silicon substrate 60 which serves as a support substrate. The lateral side of the channel is insulated and isolated from other element by the element isolation layer 74. Furthermore, a back gate 80 is in an electrically floating state.

Neither of the source electrode and the drain electrode is shown in the figure. Moreover, when the first MOSFET 7 is the N-channel type, the back gate 80 is the P-type, and the source region 68 and drain region 72 are the N-type. On the other hand, when the first MOSFET 7 is the P-channel type, the back gate 80 is the N-type, and the source region 68 and drain region 72 are the P-type.

For the MOSFET, various layout shapes are available, and the characteristics of the MOSFET differ for each layout shape.

FIG. 5 is a plan view illustrating a layout of a first MOSFET of the semiconductor device.

As shown in FIG. 5, the first MOSFET 7 has contacts 82 and 84 provided in the source region 68 and the drain region 72 respectively, and these contacts 82 and 84 are electrically connected to the source electrode and the drain electrode (not shown) respectively. The back gate 80 (not shown) is in the floating state. The first MOSFET 7 is assumed to have a gate length Lg1 and a gate width Wg1.

FIG. 6 is a plan view illustrating a layout of a second MOSFET of the semiconductor device.

As shown in FIG. 6, the second MOSFET 8 has the contacts 82 and 84 provided in the source region 68 and the drain region 72 respectively, and these contacts 82 and 84 are electrically connected to the source electrode and the drain electrode (not shown) respectively.

Moreover, the back gate 80 is drawn to above and below the source region 68, and is electrically connected to a back gate electrode (not shown). The second MOSFET 8 is assumed to have a gate length Lg2 and a gate width Wg2.

The third MOSFET 9 shown in FIG. 1 has the same layout shape as the second MOSFET 8.

Figure 7:
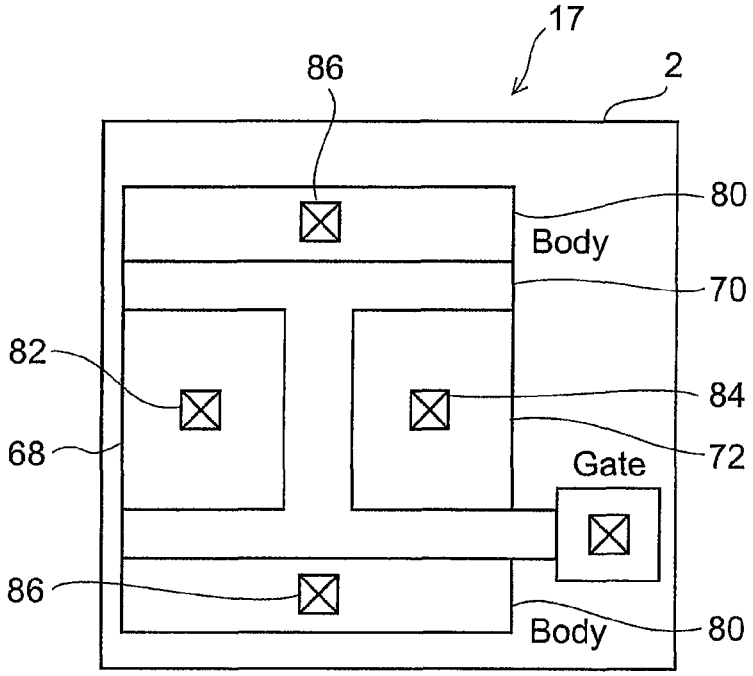
FIG. 7 is a plan view illustrating a layout of a fourth MOSFET of the semiconductor device.

FIG. 7 is a plan view illustrating a layout of a fourth MOSFET of the semiconductor device.

As shown in FIG. 7, a fourth MOSFET 17 has contacts 82 and 84 provided in the source region 68 and the drain region 72 respectively, and these contacts 82 and 84 are electrically connected to the source electrode and the drain electrode (not shown) respectively. The gate electrode 70 is formed into an H-shape.

The back gate 80 is drawn to above and below the gate electrode 70, and has a back gate contact 86 provided thereon. The back gate 80 is electrically connected to a back gate electrode (not shown).

The first MOSFET 7 is a MOSFET generally used in a bulk CMOS. The first MOSFET 7 has excellent layout efficiency and a small gate parasitic capacitance as compared to the second, the third and the fourth MOSFETs 8, 9 and 17, thus realizing shorter delay time and smaller power consumption product. However, since the back gate 80 is in the floating state, the drain breakdown voltage is low.

Each of the second, the third and the fourth MOSFETs 8, 9 and 17 has the back gate electrode, and realizes a high drain breakdown voltage by connecting the back gate 80 to the source region 68. However, to realize the high drain breakdown voltage, the back gate 80 needs to have a small parasitic resistance. Thus, the ratio of the gate width to the gate length Wg2/Lg2 needs to be set small. For example, approximately Wg2=1 μm and Lg2=1 μm.

Therefore, when designing the circuit, in order to realize a desired ratio of Wg2/Lg2, it is necessary to lay out a large number of unit FETs of Wg2=1 μm and Lg2=1 μm connected in parallel, resulting in poor layout efficiency. Moreover, the parasitic capacitance per unit gate width also becomes as large as several times that of the first MOSFET 7.

As described above, in the semiconductor device 1, the driver 5 and the power supply 6 are configured by the second MOSFET 8, the third MOSFET 9 or the fourth MOSFET 17 which mainly has the back gate 80 connected to the source region 68. On the other hand, the interface 4 is configured mainly by the first MOSFET 7.

The ON potential Von is generated in the power supply 6, and the relationship of power supply potential Vdd1<ON potential Von holds.

For the power supply potential Vdd2 to be supplied to the power supply 6, a maximum rated value is 4V, for example. In response, at least the portion of the power supply 6, which requires high breakdown voltage, is configured by the third MOSFET 9 or the fourth MOSFET 17 which has the back gate 80 connected to the source region 68. A high maximum rated value can be achieved due to the high drain breakdown voltage. Here, the entire power supply 6 may be configured by the third MOSFET 9 or the fourth MOSFET 17.

As described, the driver 5 receives the ON potential Von as a high potential power supply and the OFF potential Voff as a low potential power supply. The output amplitude becomes Von-Voff. For example, when it is assumed that ON potential Von=3.5 V and OFF potential Voff=−1.5 V, it is necessary to output control signals Con1a-Conka, Con1b-Conkb having a logical amplitude of 5V.

In response, at least the portion of the driver 5 which requires high breakdown voltage is configured by the third MOSFET 9 having the same structure as the second or the fourth MOSFET 8 or 17, which has the back gate 80 connected to the source region 68. Due to the high drain breakdown voltage thereof, a logical amplitude of 5V can be realized. Here, the entire driver 5 may be configured by the third MOSFET 9 or the fourth MOSFET 17.

For the driver 5 and the power supply 6, since a high speed operation is not required, the third MOSFET 9 having large parasitic capacitance may be used without problem.

The interface 4 needs to operate, for example, at a clock frequency of 26 MHz and a low consumption current of 0.5 mA. Here, at least a portion of the interface 4 which requires high speed operation is configured by the first MOSFET 7, thereby realizing high speed and low power consumption at the same time.

Additionally, the power supply potential Vdd1 to be supplied to the interface 4 is 1.8V, for example, which is lower than the ON potential Von. Therefore, even the first MOSFET 7 having relatively low drain breakdown voltage may be adopted without problem.

Moreover, the entire interface 4 may be configured by the first MOSFET 7.

As described, according to the semiconductor device 1, even when the terminal switch signal, that controls the connection state of the switch section 3 is input as serial data, it is possible to operate at high speed with low current consumption.

Additionally, the gate length Lg2 of the second MOSFET 8 included in the driver 5 is set longer than the gate length Lg1 of the first MOSFET 7 included in the interface 4, and the gate length Lg3 of the third MOSFET 9 included in the power supply 6 is set longer than the gate length Lg1 of the first MOSFET 7.

In the first MOSFET 7 included in the interface 4, the gate length of the PMOS and the gate length of the NMOS are assumed to be Lg1p and Lg1n respectively. In the second MOSFET 8 included in the driver 5, the gate length of the PMOS and the gate length of the NMOS are assumed to be Lg2p and Lg2n respectively. In the third MOSFET 9 included in the power supply 6, the gate length of the PMOS and the gate length of the NMOS are assumed to be Lg3p and Lg3n respectively.

Then, the gate length of each FET is set so as to satisfy the following inequalities (1) to (4):

$$Lg1p<Lg2p \quad (1)$$

$$Lg1n<Lg2n \quad (2)$$

$$Lg1p<Lg3p \quad (3)$$

$$Lg1n<Lg3n \quad (4)$$

Additionally, the gate length Lg3 of the third MOSFET 9 may be set equal to the gate length Lg2 of the second MOSFET 8. Namely, each gate length may be set to satisfy the relationship of Lg3p=Lg2p and Lg3n=Lg2n.

For example, the gate length of each FET may be set so as to satisfy the equalities (5):

$$Lg1=Lg1p=Lg1n=0.25\ \mu m$$

$$Lg2=Lg2p=Lg2n=1\ \mu m$$

$$Lg3=Lg3p=Lg3n=1\ \mu m \quad (5)$$

By setting the gate length Lg2 and the gate length Lg3 of the second MOSFET 8 and the third MOSFET 9 to 1 μm, it is possible to improve the reliability and realize a higher breakdown voltage of each FET included in the driver 5 and the power supply 6. On the other hand, by setting the gate length Lg1 of the first MOSFET 7 included in the interface 4 to a small value of 0.25 μm, it is possible to realize a higher speed operation. Moreover, in the interface 4, it is possible to increase a phase margin of the serial data in response to a clock signal to be input to the clock terminal SCLK.

By setting the gate length of the first, the second and the third MOSFETs 7, 8 and 9 as described above, it is possible to realize a still higher speed operation of the interface 4 and to improve reliability of the driver 5 and the power supply 6.

Additionally, an absolute value of the threshold voltage Vth2 of the second MOSFET 8 is set higher than that of the threshold voltage Vth1 of the first MOSFET 7, and an absolute value of the threshold voltage Vth3 of the third MOSFET 9 is set higher than that of the threshold voltage Vth1 of the first MOSFET 7.

In the first MOSFET 7 included in the interface 4, the threshold voltage of the PMOS and the threshold voltage of the NMOS are assumed to be Vth1p and Vth1n respectively. In the second MOSFET 8 included in the driver 5, the threshold voltage of the PMOS and the threshold voltage of the NMOS are assumed to be Vth2p and Vth2n respectively. In the third MOSFET 9 included in the power supply 6, the threshold voltage of the PMOS and the threshold voltage of the NMOS are assumed to be Vth3p and Vth3n respectively.

Then, the threshold voltage of each FET is set so as to satisfy the following inequalities (6) to (9):

$$|Vth1p|<|Vth2p| \quad (6)$$

$$Vth1n<Vth2n \quad (7)$$

$$|Vth1p|<|Vth3p| \quad (8)$$

$$Vth1n<Vth3n \quad (9)$$

Additionally, the threshold voltage Vth3 of the third MOSFET 9 may be set equal to the threshold voltage Vth2 of the second MOSFET 8. Namely, each threshold voltage may be set so as to satisfy the relationship of Vth3p=Vth2p and Vth3n=Vth2n.

For example, the threshold voltage of each FET may be set so as to satisfy the equalities (10):

$$Vth1p=-0.3\ V$$

$$Vth1n=0.3\ V$$

$$Vth2p=Vth3p=-0.6\ V$$

$$Vth2n=Vth3n=0.6\ V \quad (10)$$

By making the absolute value of the threshold voltage Vth1 of the first MOSFET 7 included in the interface 4 smaller, it is possible to realize a higher speed operation thereof. Moreover, it is possible to increase a phase margin of the serial data in response to a clock signal to be input to the clock terminal SCLK in the interface 4.

Additionally, by making larger the respective absolute values of the threshold voltages Vth2 and Vth3 of the second and the third MOSFETs 8 and 9 included in the driver 5 and the power supply 6 respectively, it is possible to increase a noise margin. Consequently, it is possible to improve noise immunity with respect to a radio frequency signal that leaks from the switch section 3.

Additionally, in the period in which a radio frequency signal is being input, the interface 4 only functions to output data held in the holding circuit such as a latch circuit, for example, provided in its output section. Thus, even if the noise margin of the CMOS logic circuit which configures the circuit is small, there is no concern of a false operation due to a radio frequency noise.

Thus, by setting the threshold voltages of the first, the second and the third MOSFETs 7, 8 and 9 as described above, it is possible to reduce a danger of the false operation due to a radio frequency signal while realizing high speed operation.

Second Embodiment

Figure 8:
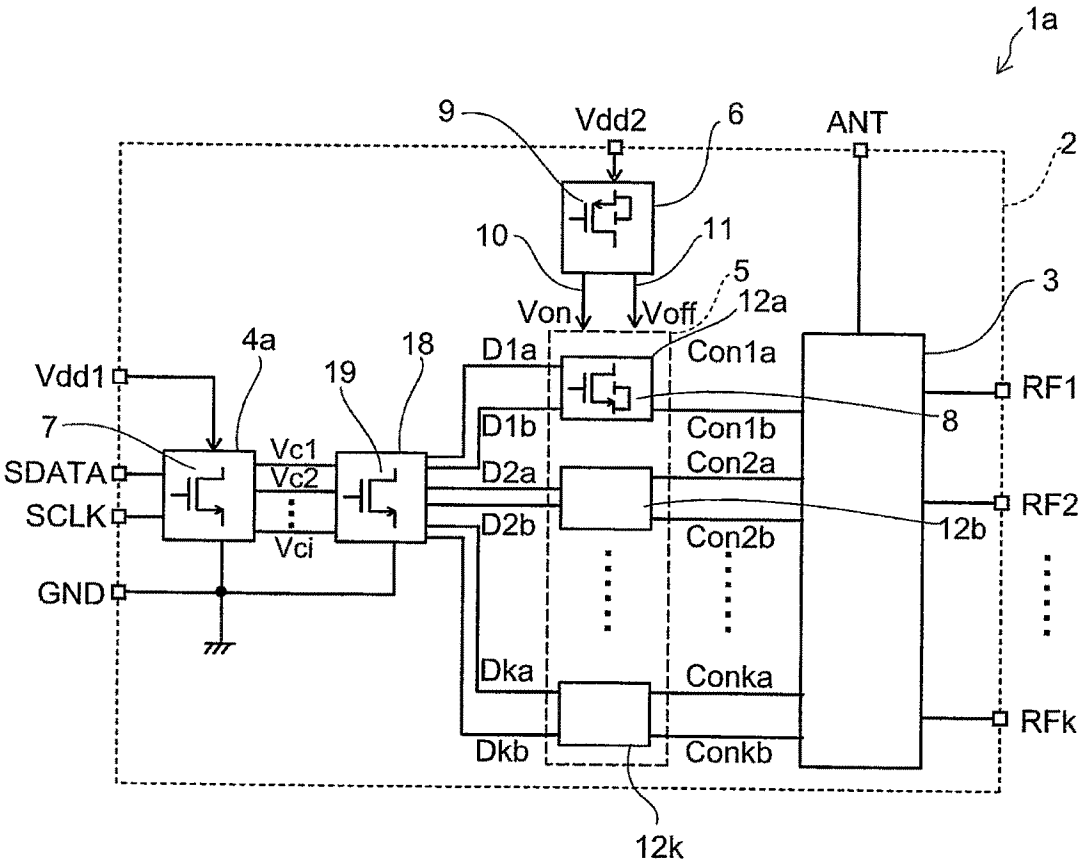
FIG. 8 is a block diagram illustrating a configuration of a semiconductor device according to a second embodiment.

FIG. 8 is a block diagram illustrating a configuration of a semiconductor device according to a second embodiment. In FIG. 8, a member used in common with the semiconductor device 1 shown in FIG. 1 is denoted by the same reference numeral.

As shown in FIG. 8, a semiconductor device 1a includes the switch section 3, an interface 4a, the driver 5, the power supply 6 and a decoder 18, which are provided on the SOI substrate 2.

In the semiconductor device 1a, the interface 4 of the semiconductor device 1 shown in FIG. 1 is replaced by the interface 4a, and the decoder 18 is further provided. The decoder 18 decodes input i-bit parallel data Vc1-Vci into 2k-bit parallel data D1a-Dka, D1b-Dkb of a differential signal. Here, i is a minimum integer of 1 or more that satisfies the relationship of $i \geq \log_2 k$.

Therefore, the serial data encoded to i-bit can be input to the switch signal terminal SDATA as a terminal switch signal. The interface 4a converts the encoded i-bit serial data into i-bit parallel data Vc1-Vci.

For the decoder 18, the power supply potential Vdd1 can be used. Further, an internal power supply circuit may be provided, for generating a power supply potential to be supplied to the decoder 18 from the power supply potential Vdd2.

Additionally, for the MOSFET 19 which configures the decoder 18, a layout of any one of the first MOSFET 7, the second MOSFET 8 and the fourth MOSFET 17 may be adopted. This is because a relatively low power supply potential is supplied to the decoder 18, and a high speed operation is not required.

The driver 5 and the power supply 6 include the second MOSFET 8 and the third MOSFET 9, each having the back gate 80 connected to the source region 68 as in the case of the semiconductor device 1.

The interface 4 includes the first MOSFET 7 that has the back gate 80 in the floating state, and the relationship of the power supply potential Vdd1<the ON potential Von holds.

According to the semiconductor device 1a, the number of stages of the holding circuit, for example, a shift register, a latch circuit, etc., of the interface 4a that operates at high speed is decreased to i-bit. Thus, it is possible to realize further reduction in power consumption.

For example, assuming the case of k=8 bit, the i-bit is 3-bit. In the semiconductor device 1 shown in FIG. 1, the interface 4 outputs differential data of 8×2=16 bit of D1a-D8a, D1b-D8kb. These signals are generated and held, for example, in the eight shift registers and latch circuits.

On the other hand, according to the semiconductor device 1a, since the decoder 18 is provided in the second stage of the interface 4a, all required is to generate the encoded data Vc1-Vci. For example, in the case of k=8 bit, i=3 bit of data Vc1, Vc2 and Vc3 are good enough. Thus, for the number of the shift registers and the latch circuits in the interface 4a, three would be enough.

As described, in the semiconductor device 1a, since the number of the first MOSFETs 7 included in the interface 4a is reduced, it is possible to further reduce power consumption.

Therefore, according to the semiconductor device 1a, it is possible to realize with ease a semiconductor device in which a signal for controlling the connection state of the switch section 3 is serially transmitted, and to reduce power consumption in the serial transmission.

Third Embodiment

Figure 9:
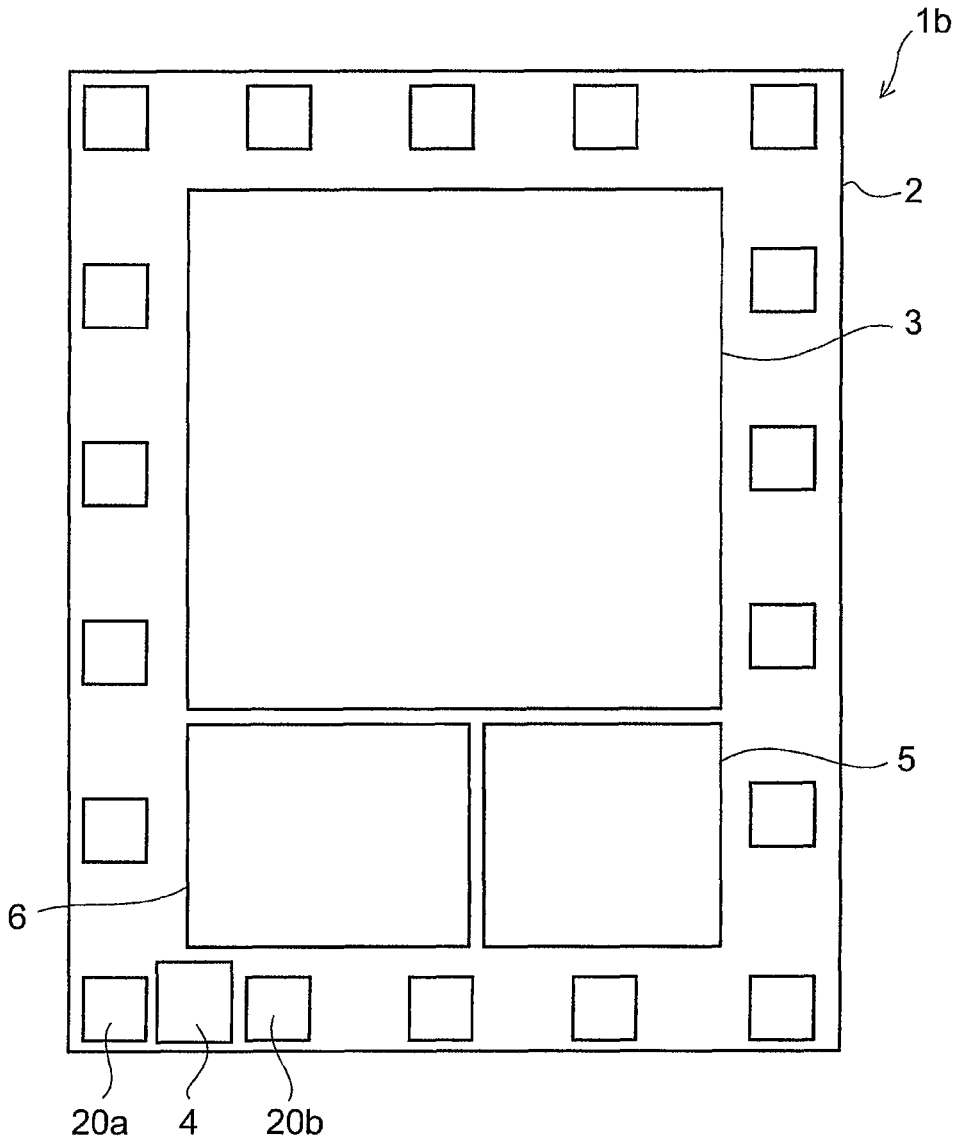
FIG. 9 is a plan view illustrating a configuration of a semiconductor device according to a third embodiment.

FIG. 9 is a plan view illustrating a configuration of a semiconductor device according to a third embodiment.

In FIG. 9, a layout of a semiconductor device 1b is shown schematically. In FIG. 9, a member used in common with the semiconductor device 1 shown in FIG. 1 is denoted by the same reference numeral.

A semiconductor device 1b includes the interface 4, the driver 5, the power supply 6 and pads 20a and 20b, which are provided on the SOI substrate 2. The switch section 3, interface 4, the driver 5, and the power supply 6 respectively have the same circuit configuration as the semiconductor device 1 shown in FIG. 1.

In the semiconductor device 1b, the interface 4 is provided in an area between the pad 20a and the pad 20b. Here, the pad 20a and the pad 20b are provided for the ground GND and the power supply potential Vdd1 respectively. Here, either one of the pads 20a and 20b is provided for the ground GND, and the other one is provided for receiving the power supply potential Vdd1.

The interface 4 includes the first MOSFET 7 having excellent layout efficiency. Thus, it is sufficiently possible to lay it out in the narrow area between the pads. Therefore, there is no increase in a chip area for adopting the serial interface of the terminal switch signal. Moreover, since the power supply pad and the ground pad are provided in close vicinity, it is possible to perform a high speed operation under stable conditions.

Therefore, according to the semiconductor device 1b, it is possible to easily realize a semiconductor device in which a signal for controlling the connection state of the switch section 3 is serially transmitted, and to maintain the same chip area as that of the semiconductor in which a parallel transmission is performed.

For the semiconductor devices 1 and 1a, explanations have been given through the case of inputting a terminal switch signal of serial data to the switch signal terminal SDATA. However, for the serial data, data other than the k-bit of the radio frequency terminals RF1-RFk or encoded i-bit data may be added.

For example, a microprocessor or the like generally outputs data to a plurality of elements. Therefore, to switch signal terminals SDATA, a plurality of elements may be connected, or serial data having added thereto an address for identifying each element may be input. In this case, the interfaces 4 and 4a identify the address and convert the input serial data into parallel data for output.

Furthermore, the switch signal terminal SDATA may be connected to a bi-directional bus capable of receiving and outputting. In this case, the interfaces 4 and 4a may convert parallel data into serial data to output it to the switch signal terminal SDATA.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

an interface including a first MOSFET and converting a [terminal switch] *serial input* signal [of input serial data] into parallel [data] *signals*, the first MOSFET *being* provided on [an SOI] *a silicon-on-insulator* substrate and having a back gate in a floating state [and];

a power supply including a second MOSFET and generating an [ON] *output* potential *that is* higher than [a potential of] a power supply *potential* to be supplied to the interface, the second MOSFET *being* provided on [an SOI] *the silicon-on-insulator* substrate and having a back gate connected to a source *of the second MOSFET*;

a driver including a third MOSFET and outputting a control signal [for controlling the ON potential to be in a high level] according to the parallel [data] *signals*, the third MOSFET provided on [an SOI] *the silicon-on-insulator* substrate and having a back gate connected to a source *of the third MOSFET*; and a switch section provided on the [SOI] *silicon-on-insulator* substrate and switching [connection] *connections* between *a plurality of* terminals [by inputting] *according to* the control signal.

2. The device according to claim 1, wherein a gate length of the second MOSFET is longer than [that] *a gate length* of the first MOSFET.

3. The device according to claim 1, wherein a gate length of the third[,] MOSFET is longer than [that] *a gate length* of the first MOSFET.

4. The device according to claim 1, wherein an absolute value of a threshold voltage of the second MOSFET is larger than that of a threshold voltage of the first MOSFET.

5. The device according to claim 1, wherein an absolute value of a threshold voltage of the third MOSFET is larger than that of a threshold voltage of the first MOSFET.

6. The device according to claim 1, further comprising:

a decoder decoding the parallel data.

7. The device according to claim 1, wherein the back gate of the second MOSFET is [drawn to both] *on two* sides of the source [in a vertical direction to the SOI substrate] *of the second MOSFET, the two sides of the source of the second MOSFET being spaced from each other in a direction parallel to a gate width direction of the second MOSFET.*

8. The device according to claim 7, wherein the second MOSFET is formed in an H-shape [in the vertical direction to the SOI substrate].

9. The device according to claim 1, wherein the back gate of the third MOSFET is [drawn to both] *on two* sides of the source [in a vertical direction to the SOI substrate] *of the third MOSFET, the two sides of the source of the third MOSFET being spaced*

*from each spaced from each other in a direction parallel to a gate width direction of the third MOSFET.*

10. The device according to claim 9, wherein the third MOSFET is formed in an H-shape [in the vertical direction to the SOI substrate].

11. The device according to claim 1, wherein the third MOSFET has the same planar layout shape as the second MOSFET.

12. The device according to claim 1, wherein the first MOSFET has a lower breakdown voltage than the second MOSFET.

13. The device according to claim 1, wherein the first MOSFET has a lower breakdown voltage than the third MOSFET.

14. The device according to claim 1, wherein the first MOSFET has a smaller layout area than the second MOSFET.

15. The device according to claim 1, wherein the first MOSFET has a smaller layout area than the third MOSFET.

16. The device according to claim 1, further comprising:

a power supply pad provided [on both sides of the interface] on the [SOI] *silicon-on-insulator* substrate *on a first side of the interface, the power supply pad* for supplying power to the interface; and a ground pad *provided on the silicon-on-insulator substrate on a second side of the interface opposite the first side.*

*17. A semiconductor device, comprising:*

*an interface provided on a silicon-on-insulator substrate and configured to convert serial data into parallel data, the interface including a first MOSFET having a back gate with a floating potential;*

*a first power supply provided on the silicon-on-insulator substrate and configured to generate a first potential that is greater than a second potential, the second potential being supplied to the interface by a second power supply, the first power supply including a second MOSFET having a back gate connected to a source of the second MOSFET;*

*a driver provided on the silicon-on-insulator substrate and including a third MOSFET having a back gate connected to a source of the third MOSFET, the driver configured to generate a plurality of control signals based on the first potential according to the parallel data; and*

*a switch section provided on the silicon-on-insulator substrate and including a plurality of terminals, the switch section configured to switch connections among the plurality of terminals according to the plurality of the control signals.*

*18. The device according to claim 17, wherein*

*a gate length of the second MOSFET is longer than a gate length of the first MOSFET.*

*19. The device according to claim 17, wherein*

*a gate length of the third MOSFET is longer than a gate length of the first MOSFET.*

*20. The device according to claim 17, wherein*

*an absolute value of a threshold voltage of the second MOSFET is larger than an absolute value of a threshold voltage of the first MOSFET.*

*21. The device according to claim 17, wherein*

*an absolute value of a threshold voltage of the third MOSFET is larger than an absolute value of a threshold voltage of the first MOSFET.*

*22. The device according to claim 17, further comprising:*

*a decoder configured to decode the parallel data and supply decoded data to the driver.*

*23. The device according to claim 17, wherein*

*the first MOSFET has a lower breakdown voltage than the second MOSFET.*

*24. The device according to claim 17, wherein*

*the first MOSFET has a lower breakdown voltage than the third MOSFET.*

*25. The device according to claim 17, wherein*

*the first MOSFET has a smaller layout area than the second MOSFET.*

*26. The device according to claim 17, wherein*

*the first MOSFET has a smaller layout area than the third MOSFET.*

*27. The device according to claim 17, further comprising:*

*a power supply pad provided on the silicon-on-insulator substrate on a first side of the interface, the power supply pad for supplying power to the interface; and*

*a ground pad provided on the silicon-on-insulator substrate on a second side of the interface opposite the first side.*

*28. The device according to claim 17, wherein*

*the interface, the first power supply, the driver, and the switch section are included in a radio frequency switch device.*

*29. The device according to claim 28, wherein*

*the plurality of terminals includes an antenna terminal and a plurality of radio frequency input/output terminals, and the switch section is configured to switch connections among the plurality of terminals for transmitting and receiving radio frequency signals by the antenna terminal.*

*30. The device according to claim 28, wherein*

*a gate length of the second MOSFET is longer than a gate length of the first MOSFET.*

*31. The device according to claim 28, wherein*

*a gate length of the third MOSFET is longer than a gate length of the first MOSFET.*

*32. The device according to claim 28, wherein*

*the first MOSFET has a smaller layout area than the second MOSFET.*

*33. The device according to claim 28, wherein*

*the first MOSFET has a smaller layout area than the third MOSFET.*

* * * * *